United States Patent
Han et al.

(10) Patent No.: US 11,392,231 B2
(45) Date of Patent: *Jul. 19, 2022

(54) ELECTRONIC DEVICE HAVING A SENSING PATTERN

(71) Applicant: Samsung Display Co., Ltd., Yongin-si (KR)

(72) Inventors: Hyeyun Han, Hwaseong-si (KR); Wonkyu Kwak, Seongnam-si (KR); Hwan-hee Jeong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/063,427

(22) Filed: Oct. 5, 2020

(65) Prior Publication Data

US 2021/0019008 A1    Jan. 21, 2021

Related U.S. Application Data

(63) Continuation of application No. 16/250,786, filed on Jan. 17, 2019, now Pat. No. 10,795,475.

(30) Foreign Application Priority Data

Feb. 12, 2018    (KR) .......................... 10-2018-0017154

(51) Int. Cl.
*G06F 3/041*    (2006.01)
*H01L 27/32*    (2006.01)

(52) U.S. Cl.
CPC .......... *G06F 3/0412* (2013.01); *G06F 3/0416* (2013.01); *H01L 27/323* (2013.01); *H01L 27/3223* (2013.01); *H01L 27/3276* (2013.01)

(58) Field of Classification Search
CPC .. G06F 3/0412; G06F 3/0416; G06F 3/04164; G06F 3/0443; H01L 27/3223; H01L 27/323; H01L 27/3276
See application file for complete search history.

(56) References Cited

U.S. PATENT DOCUMENTS 6,757,002 B1    6/2004 Oross et al.
7,288,888 B2   10/2007 Suh
(Continued)

FOREIGN PATENT DOCUMENTS

CN    108241455 A    7/2018
KR   2001-0057117 A   7/2001
(Continued)

OTHER PUBLICATIONS

U.S. Office Action dated Jul. 13, 2020, issued in U.S. Appl. No. 16/592,272 (29 pages).

(Continued)

*Primary Examiner* — Chun-Nan Lin
(74) *Attorney, Agent, or Firm* — Lewis Roca Rothgerber Christie LLP

(57) ABSTRACT

A sensing unit includes a base layer having a sensing area, the sensing area including a first sensing area, a second sensing area protruding from the first sensing area in a first direction, and a third sensing area protruding from the first sensing area in the first direction, and a non-sensing area adjacent to the sensing area; sensing patterns including a normal sensing pattern in the first sensing area, a first notch sensing pattern in the second sensing area, and a second notch sensing pattern in the third sensing area; a sensing line in the non-sensing area; a connection line in the non-sensing area and between the sensing line and the normal sensing pattern in a plane view to electrically connect the first notch sensing pattern and the second notch sensing pattern; and a (Continued)

connection part electrically connecting the sensing line and the normal sensing pattern.

20 Claims, 9 Drawing Sheets

(56) References Cited

U.S. PATENT DOCUMENTS

| | | | |
|---|---|---|---|
| 8,497,845 B2 | 7/2013 | Wang et al. | |
| 8,736,565 B2 | 5/2014 | Kim et al. | |
| 9,898,125 B2 | 2/2018 | Yang et al. | |
| 10,534,470 B2 | 1/2020 | Lin | |
| 2011/0048812 A1* | 3/2011 | Yilmaz | G06F 3/0443 178/18.06 |
| 2014/0204285 A1 | 7/2014 | Jang | |
| 2015/0034921 A1 | 2/2015 | Kim | |
| 2015/0115297 A1* | 4/2015 | Lee | H01L 51/5275 257/89 |
| 2015/0138146 A1 | 5/2015 | Hong | |
| 2016/0034742 A1 | 2/2016 | Kim et al. | |
| 2016/0062537 A1* | 3/2016 | Kim | G06F 3/0445 345/174 |
| 2016/0170513 A1 | 6/2016 | Lee et al. | |
| 2016/0179229 A1 | 6/2016 | Ahn | |
| 2016/0283031 A1 | 9/2016 | Hwang et al. | |
| 2018/0006265 A1 | 1/2018 | Oh | |
| 2018/0026051 A1* | 1/2018 | Dong | G06F 3/041 348/450 |
| 2018/0348929 A1* | 12/2018 | Rhe | G06F 3/04164 |
| 2018/0373359 A1 | 12/2018 | Han et al. | |
| 2019/0121463 A1 | 4/2019 | Park et al. | |
| 2019/0179445 A1 | 6/2019 | Moon | |

FOREIGN PATENT DOCUMENTS

| | | |
|---|---|---|
| KR | 10-0560787 B1 | 3/2006 |
| KR | 10-1282469 B1 | 7/2013 |
| KR | 10-1553324 B1 | 9/2015 |
| KR | 10-2017-0080285 A | 7/2017 |
| KR | 10-2017-0112464 A | 10/2017 |
| KR | 10-2018-0003329 A | 1/2018 |
| KR | 10-2019-0020213 A | 2/2019 |
| KR | 10-2019-0098295 A | 8/2019 |

OTHER PUBLICATIONS

U.S. Notice of Allowance dated Dec. 9, 2020, issued in U.S. Appl. No. 16/592,272 (11 pages).

* cited by examiner

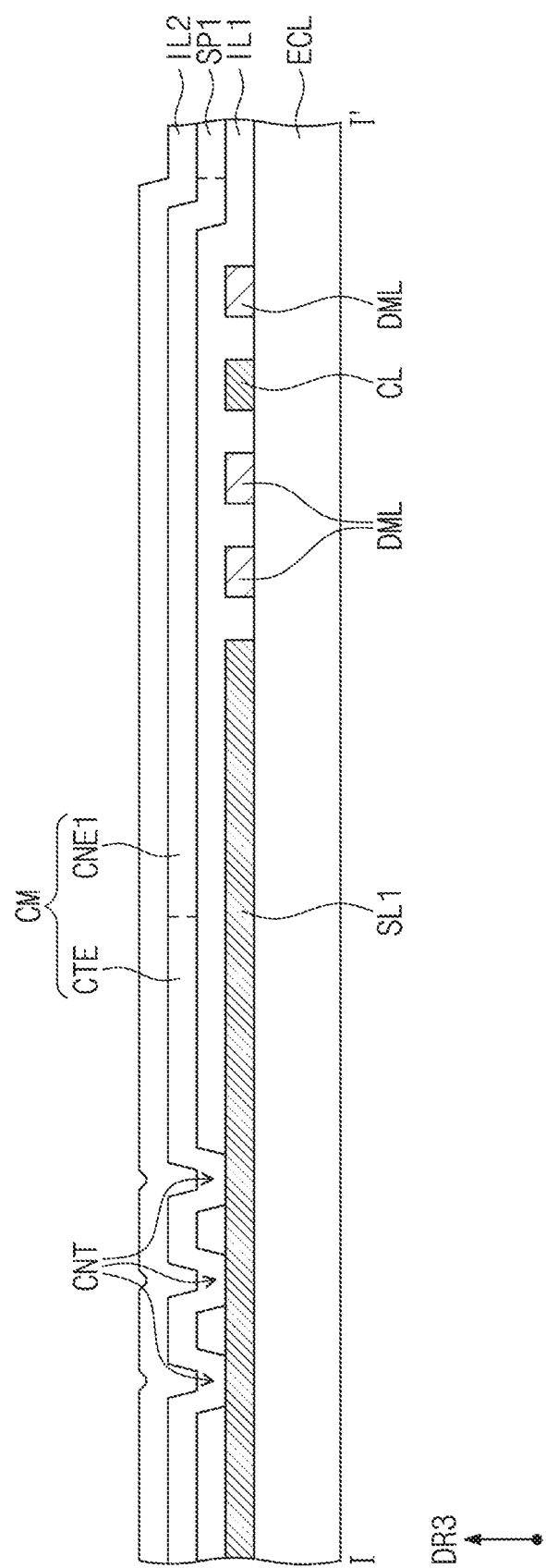

ELECTRONIC DEVICE HAVING A SENSING PATTERN

CROSS-REFERENCE TO RELATED APPLICATIONS

This application is a continuation of U.S. patent application Ser. No. 16/250,786, filed Jan. 17, 2019, which claims priority to and the benefit of Korean Patent Application No. 10-2018-0017154, filed Feb. 12, 2018, the entire content of both of which is incorporated herein by reference.

BACKGROUND

Aspects of some example embodiments of the present invention relate to a sensing unit having improved reliability and a display device including the sensing unit.

SUMMARY

Aspects of some example embodiments of the present invention relate to a sensing unit having improved reliability and a display device including the sensing unit.

According to some example embodiments, the active area of a display device may have a square or circular shape as well as an irregular shape. That is, the display device may display an image through an active area having various shapes and areas, and may detect whether or not a touch is generated. Various types of line designs may be utilized by an active area having an irregular shape.

Aspects of some example embodiments of the present invention include a line design method for a sensing unit and a display device, and to provide a sensing unit and a display device with improved reliability.

According to some example embodiments of the present invention, a sensing unit includes: a base layer where a sensing area including a first sensing area, a second sensing area protruding from the first sensing area in a first direction, and a third sensing area protruding from the first sensing area in the first direction, and a non-sensing area adjacent to the sensing area are defined; sensing patterns including a normal sensing pattern disposed in the first sensing area, a first notch sensing pattern disposed in the second sensing area, and a second notch sensing pattern disposed in the third sensing area; a sensing line disposed in the non-sensing area and electrically connected to the normal sensing pattern; a connection line disposed in the non-sensing area and disposed between the sensing line and the normal sensing pattern in a plane view to electrically connect the first notch sensing pattern and the second notch sensing pattern; and a connection part configured to electrically connect the sensing line and the normal sensing pattern, wherein the connection part includes a first connection electrode extending from the normal sensing pattern in a direction toward the sensing line and a first contact electrode extending from the first connection electrode in a direction different from the extending direction of the first connection electrode, and the connection part contacts the sensing line in an area overlapping the first contact electrode in the plane view.

In an embodiment, the sensing unit may further include an insulating layer disposed between the sensing line and the connection part on a cross section, wherein the connection part may be electrically connected to the sensing line through a contact hole provided in the insulating layer, and the contact hole may be provided in an area overlapping the first contact electrode in the plane view.

In an embodiment, the contact hole may be provided spaced apart from the first connection electrode, and the contact hole may not be overlapped with the first connection electrode in the plane view.

In an embodiment, the sensing line may include a sensing line part and a sensing pad extending from the sensing line part and overlapping the connection part in the plane view, the sensing pad may be divided into a first area adjacent to the connection line and a second area spaced apart from the connection line with the first area interposed therebetween, the contact hole may be provided so as to overlap with the second area, and the contact hole may not be overlapped with the first area in the plane view.

In an embodiment, a first width of the sensing pad may be greater than a second width of the sensing line.

In an embodiment, the sensing unit may further include a dummy line disposed between the connection line and the sensing line in the plane view.

In an embodiment, the connection part may further include a second connection electrode extending along a direction from the normal sensing pattern toward the sensing line, the second connection electrode may be disposed apart from the first connection electrode, and the first connection electrode and the second connection electrode may be connected to each other by the first contact electrode.

In an embodiment, the connection part may further include a second contact electrode extending from the first connection electrode in a direction opposite to the extending direction of the first contact electrode, wherein the connection part may contact the sensing line in an area overlapping the second contact electrode in the plane view.

In an embodiment, the sensing patterns and the connection part may be disposed on the same layer on a cross section, and the connection line may be disposed on a layer different from the connection part on the cross section.

In an embodiment, the connection part may include a transparent conductive oxide.

In an embodiment, the connection part may include a metallic material.

In an embodiment of the inventive concept, a sensing unit includes: a first sensing electrode including first sensing patterns; a second sensing electrode including second sensing patterns; a first sensing line electrically connected to the first sensing electrode; a second sensing line electrically connected to the second sensing electrode and disposed between the first sensing line and the first sensing electrode; a connection part overlapping the second sensing line in a plane view and configured to connect the first sensing line and the first sensing electrode; and an insulating layer disposed between the connection part and the first sensing line and between the connection part and the second sensing line, wherein the connection part includes: a connection electrode connected to the first sensing electrode and extending along a direction from the first sensing electrode toward the first sensing line; and a contact electrode connected to the connection electrode and extending in a direction different from a direction in which the connection electrode extends from the connection electrode, wherein the contact electrode is electrically connected to the first sensing line through a contact hole provided in the insulating layer, and the contact hole is provided only in an area overlapping the contact electrode in the plane view.

In an embodiment, the sensing unit may further include a dummy line disposed between the first sensing line and the second sensing line in the plane view.

In an embodiment, the connection electrode may be provided in a plural number, and the connection electrodes may be spaced apart from each other with the contact electrode interposed therebetween in the plane view.

In an embodiment, the contact electrode may be provided in plural number and the contact electrodes may be spaced apart from each other with the connection electrode interposed therebetween in the plane view.

In an embodiment of the inventive concept, a display device includes: a display panel configured to display an image; a base layer disposed on the display panel, where a sensing area including a normal part and a notch part protruding from the normal part, and a non-sensing area adjacent to the sensing area are defined; a first sensing electrode disposed in the sensing area and including a plurality of first sensing patterns arranged along a first direction; a second sensing electrode disposed on the normal part and including a plurality of second sensing patterns arranged along a second direction intersecting the first direction; a third sensing electrode disposed on the notch part and including a plurality of third sensing patterns arranged along the second direction; a first sensing connection electrode configured to electrically connect the plurality of first sensing patterns to each other; a second sensing connection electrode configured to electrically connect the plurality of second sensing patterns to each other; a first sensing line electrically connected to one end of the first sensing electrode; a second sensing line electrically connected to one end of the second sensing electrode; a connection line electrically connected to one end of the third sensing electrode and disposed between the first sensing line and the first sensing electrode in a plane view; a connection part electrically connected to the first sensing line and the first sensing electrode and configured to overlap the connection line in the plane view; and an insulating layer disposed between the connection line and the connection part on a cross section and configured to insulate the connection line from the connection part, wherein the connection part includes a connection electrode extending from the first sensing electrode toward the first sensing line and a contact electrode extending in a direction different from a direction in which the connection electrode extends from the connection electrode, and the first sensing line and the contact electrode are electrically connected through a contact hole provided in the insulating layer between the contact electrode and the first sensing line.

In an embodiment, the contact holes may not be overlapped with the connection electrode.

In an embodiment, the first sensing line may include a sensing line part and a sensing pad extending from the sensing line part and overlapping the connection part in the plane view, the sensing pad may be divided into a first area adjacent to the connection line in the plane view and a second area spaced apart from the connection line with the first area interposed therebetween, and the contact hole may be provided so as to overlap with the second area, and the contact hole may not be overlapped with the first area in the plane view.

In an embodiment, the display device may further include a dummy line disposed between the first sensing line and the connection line.

In an embodiment, the display device may further include a fourth sensing line electrically connected to the other end of the first sensing electrode.

BRIEF DESCRIPTION OF THE FIGURES

The accompanying drawings are included to provide a further understanding of aspects of some example embodiments of the present invention, and are incorporated in and constitute a part of this specification. The drawings illustrate aspects of some example embodiments of the present invention and, together with the description, serve to explain aspects of some example embodiments. In the drawings:

FIG. 5A is a cross-sectional view taken along the line I-I' shown in FIG. 4;

DETAILED DESCRIPTION

Figure 1:
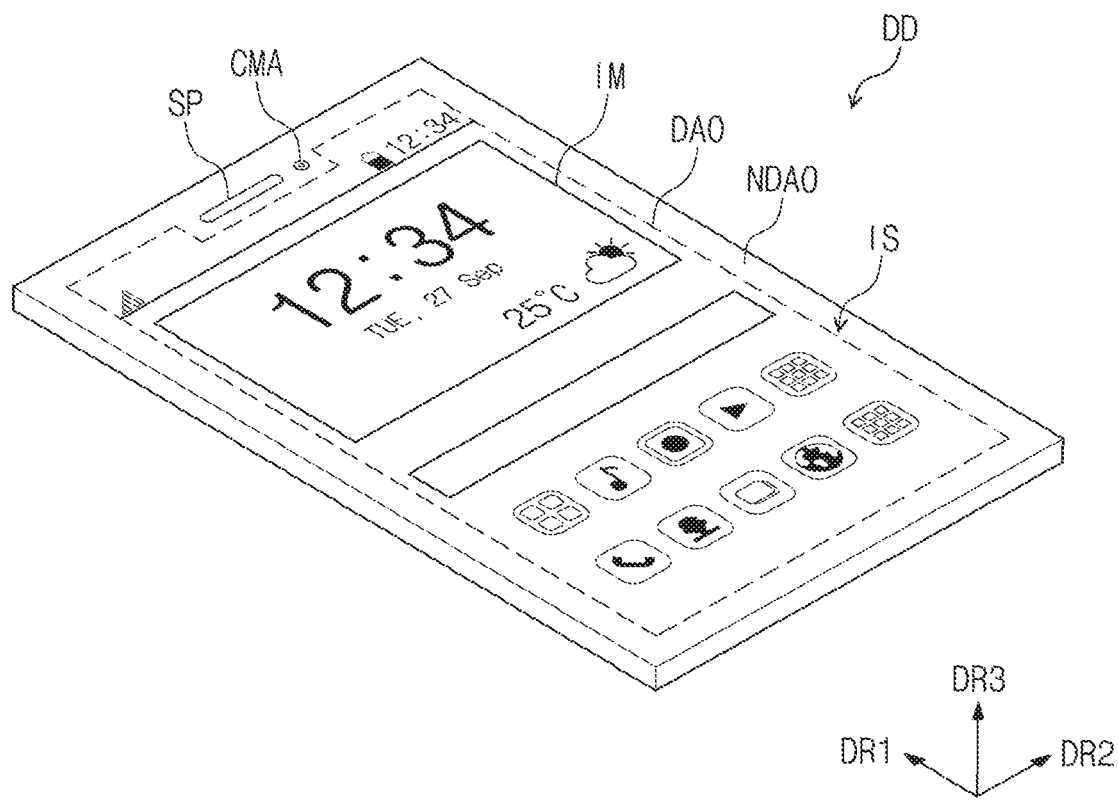
FIG. 1 is a cross-sectional view of a display device according to some example embodiments of the present invention.

Hereinafter, aspects of some example embodiments of the present invention will be described with reference to the drawings. In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

FIG. 1 is a perspective view of a display device according to some example embodiments of the present invention.

Referring to FIG. 1, a display device DD may display an image IM through a display surface IS. The display surface IS of the display device DD may be the outermost surface of the display device DD and may be a surface that a user views.

In FIG. 1, a clock display window and application icons are shown as an example of the image IM. Referring to FIG. 1, the display surface IS has a surface defined by a first direction DR1 and a second direction DR2 intersecting the first direction DR1. However, in other embodiments of the inventive concept, the display surface of the display device may have a curved shape.

The normal direction of the display surface IS, that is, a thickness direction of the display device DD, indicates a third direction DR3. The directions that the first to third directions DR1, DR2, and DR3 indicate may be converted to other directions as a relative concept. Hereinafter, first to third directions as directions that the respective first to third directions DR1, DR2, and DR3 indicate refer to the same reference numerals.

FIG. 1 illustrates an example embodiment in which the display device DD is a portable electronic device. However, the display device DD may be used in medium-sized electronic devices such as personal computers, notebook computers, personal digital terminals, car navigation units, game machines, smart phones, tablets, and cameras in addition to large-sized electronic devices such as televisions, monitors, or external billboards. These are simply suggested as embodiments and embodiments of the present invention may be utilized in other electronic devices without departing from the spirit and scope of the present invention.

The display surface IS may include a display area DA0 where an image IM is displayed and a non-display area NDA0 adjacent to the display area DA0. The non-display area NDA0 is an area where no image is displayed. The display area DA0 may have an irregular shape. For example, the display area DA0 may have a shape in which at least one side of the rectangular shape protrudes.

The non-display area NDA0 may encompass the display area DA0. However, embodiments of the present invention are not limited thereto, and a form or shape of the display area DA0 and a form or shape of the non-display area NDA0 may vary according to the design of the display device DD.

The display device DD may include a speaker SP and a camera module CMA. The speaker SP and the camera module CMA are arranged to overlap with the non-display area NDA0 and do not overlap with the display area DA0.

Figure 2A:
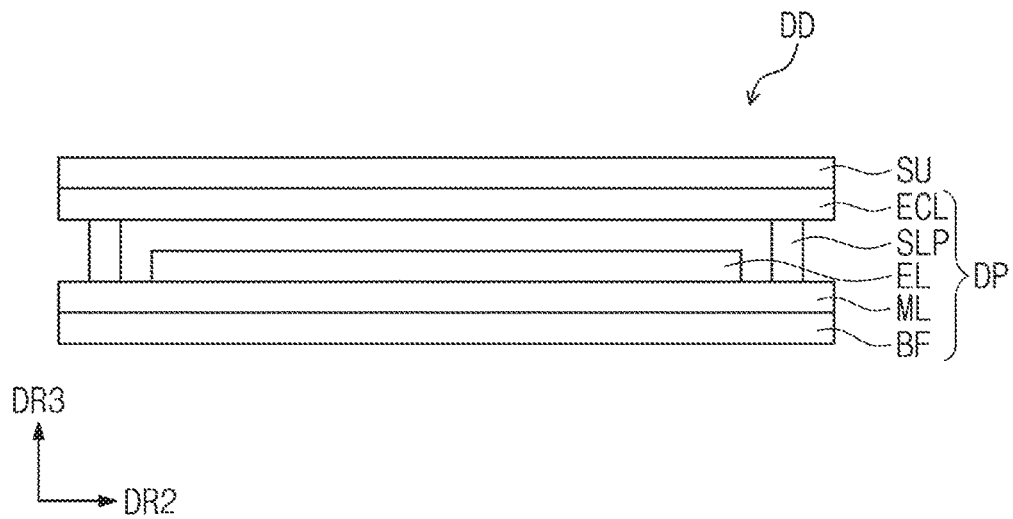
FIG. 2A is a cross-sectional view of a display device according to some example embodiments of the present invention.

FIG. 2A is a cross-sectional view of a display device according to some example embodiments of the present invention.

Referring to FIG. 2A, a display device DD may include a display panel DP and a sensing unit SU.

The display panel DP may be a light-emitting display panel, and is not particularly limited. For example, the display panel DP may be an organic light emitting display panel or a quantum dot light emitting display panel. The light emitting layer of the organic light emitting display panel includes an organic light emitting material. The light emitting layer of a quantum dot light emitting display panel includes quantum dot, and quantum rod. Hereinafter, the display panel DP is described as an organic light emitting display panel.

The display panel DP includes a base substrate BF, a circuit layer ML, a light emitting element layer EL, and a sealing substrate ECL.

The base substrate BF may include a plastic substrate, a glass substrate, or an organic/inorganic composite substrate. Alternatively, the base substrate BF may be a laminated structure including a plurality of insulating layers. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, or perylene resin.

The circuit layer ML may include a plurality of insulating layers, a plurality of conductive layers, and a semiconductor layer. The plurality of conductive layers of the circuit layer ML may constitute signal lines or a control circuit of a pixel.

The light emitting element layer EL includes display elements, such as organic light emitting diodes. However, embodiments of the present invention are not limited thereto. Depending on the type of the display panel DP, the light emitting element layer EL may include inorganic light emitting diodes or organic-inorganic hybrid light emitting diodes.

The sealing substrate ECL seals the light emitting element layer EL. The sealing substrate ECL protects the light emitting element layer EL from contaminants such as moisture, oxygen, and dust particles. The sealing substrate ECL may be coupled to the base substrate BF through a sealing part SLP. The sealing part SLP may include a frit. However, this is merely an example, and the material constituting the sealing part SLP is not limited thereto.

A sensing unit SU may be arranged on the sealing substrate ECL. Although the sealing substrate ECL is included in the display panel DP in FIG. 2A, the sealing substrate ECL may be included in the sensing unit SU. In this case, the sealing substrate ECL may be referred to as the base layer ECL.

In FIG. 2A, the sensing unit SU is directly formed on the sealing substrate ECL, but embodiments of the present invention are not limited thereto. For example, an adhesive member may be arranged between the sensing unit SU and the sealing substrate ECL, and the sensing unit SU and the sealing substrate ECL may be coupled by the adhesive member.

Figure 2B:
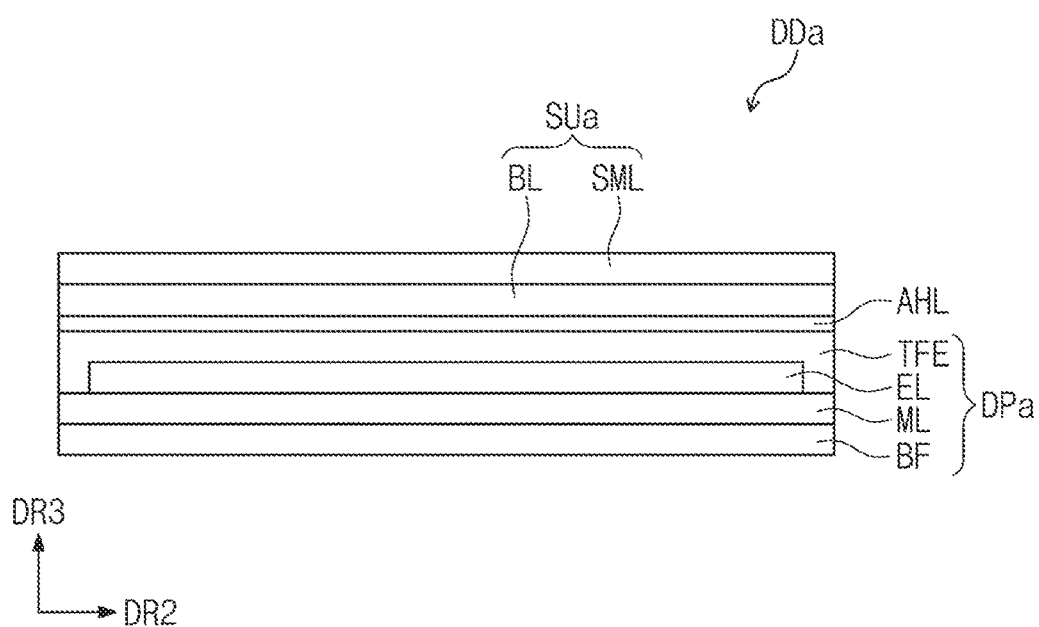
FIG. 2B is a cross-sectional view of a display device according to some example embodiments of the present invention.

FIG. 2B is a cross-sectional view of a display device according to some example embodiments of the present invention.

Referring to FIG. 2B, a display device DDa may include a display panel DPa and a sensing unit SUa.

The display panel DPa includes a base substrate BF, a circuit layer ML, a light emitting element layer EL, and a thin film sealing layer TFE.

The thin film sealing layer TFE seals the light emitting element layer EL. The thin film sealing layer TFE includes at least one insulating layer. The thin film sealing layer TFE according to an embodiment of the inventive concept may include at least one organic film and at least one sealing inorganic film.

The sealing inorganic film protects the light emitting element layer EL from moisture/oxygen, and the sealing organic film protects the light emitting element layer EL from foreign substances such as dust particles. The sealing inorganic film may include a silicon nitride layer, a silicon oxynitride layer, and a silicon oxide layer, a titanium oxide layer, or an aluminum oxide layer and is not limited thereto.

The sealing organic layer may include an acryl-based organic layer, but is not limited thereto.

The sensing unit SUa may include a base layer BL and a sensing circuit layer SML. The sensing circuit layer SML may include a plurality of insulating layers, and a plurality of conductive layers. For example, the conductive layers of the sensing circuit layer SML may constitute sensing patterns, sensing line, and connection line.

The sensing unit SUa and the display panel DPa may be coupled to each other by the adhesive member AHL. The adhesive member AHL may be an organic adhesive layer such as an Optically Clear Adhesive (OCA) film, Optically Clear Resin (OCR), or a Pressure Sensitive Adhesive (PSA) film.

According to some example embodiments of the present invention, the adhesive layer AHL and the base layer BL of the sensing unit SUa may be omitted. In this case, the sensing circuit layer SML may be formed and provided through a continuous process on the thin film sealing layer TFE.

Figure 3:
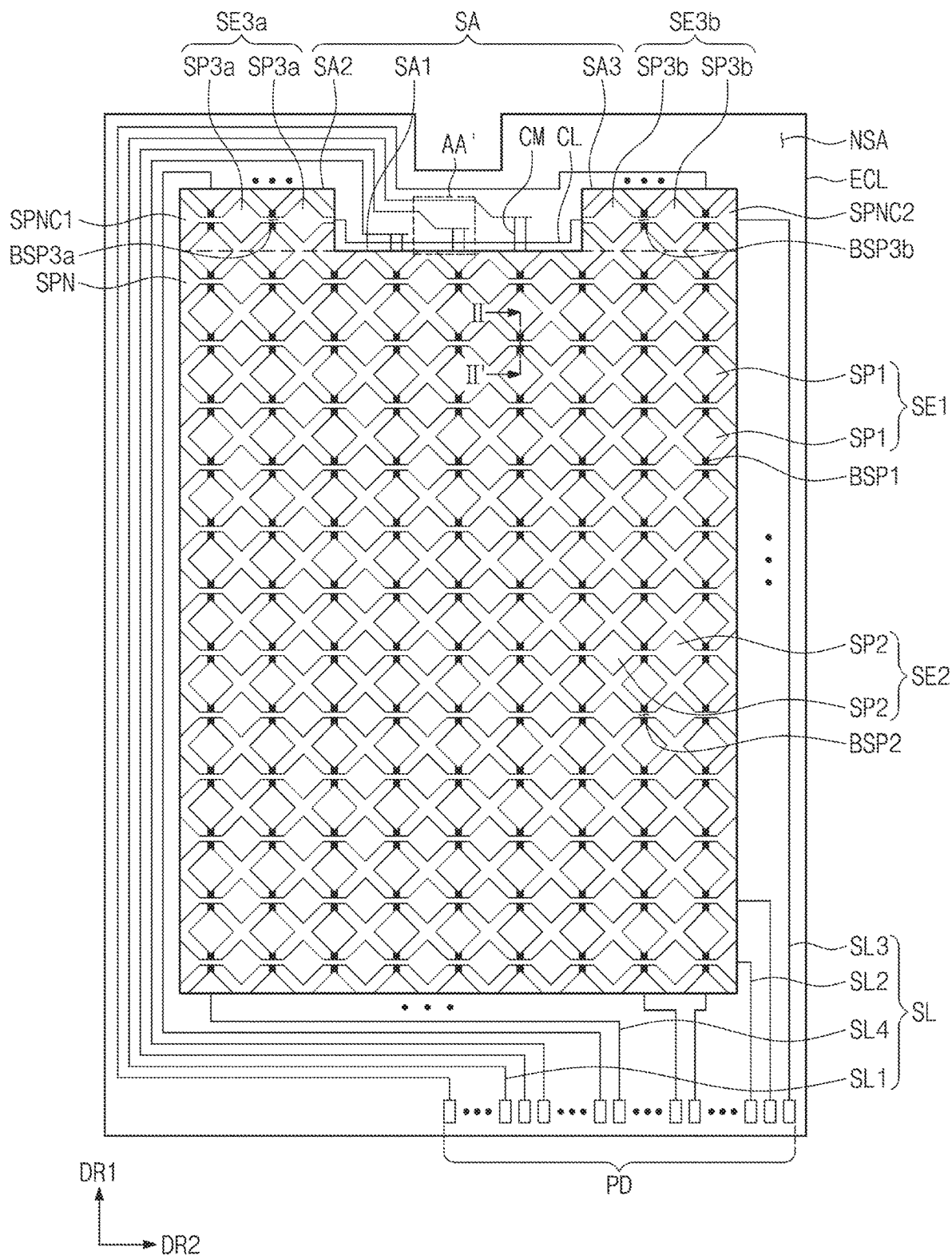
FIG. 3 is a plan view of a sensing unit according to some example embodiments of the present invention.

FIG. 3 is a plan view of a sensing unit according to some example embodiments of the present invention.

Referring to FIG. 3, the base layer ECL may include a sensing area SA and a non-sensing area NSA adjacent to the sensing area SA. The base layer ECL may be the sealing substrate ECL described with reference to FIG. 2A or the base layer BL described with reference to FIG. 2B.

The sensing area SA may be an area for sensing an externally applied input. The external input may be, for example, a touch by a user's hand. The externally applied input may be provided in various forms. For example, the external input includes various types of external inputs such as a part of the user's body, a stylus pen, light, heat, or pressure. In addition, an input that a part of the body, such as a user's hand, touches, as well as an approaching or adjacent space touch (e.g., hovering) may be a form of input.

The sensing area SA may include a first sensing area SA1, a second sensing area SA2, and a third sensing area SA3. The first sensing area SA1 may have a rectangular shape in a plane view. The second sensing area SA2 and the third sensing area SA3 may protrude from the first sensing area SA1 in a first direction DR1. The first sensing area SA1 may be referred to as a normal part and the second and third sensing areas SA2 and SA3 may be referred to as notch parts. In this specification, viewing in the plane may mean viewing in a direction parallel to the third direction DR3 described with reference to FIG. 1.

According to some example embodiments of the present invention, the second and third sensing areas SA2 and SA3 are provided in addition to the first sensing area SA1. However, the number of sensing areas provided protruding from the first sensing area SA1 is not limited. For example, the sensing area provided protruding from the first sensing area SA1 may be one, or may be three or more. The camera module CMA and the speaker SP described with reference to FIG. 1 may be disposed in an area between the second sensing area SA2 and the third sensing area SA3.

The second sensing area SA2 protrudes in a first direction DR1 in one area of one side edge of the first sensing area SA1 and the third sensing area SA3 protrudes in the first direction DR1 in the other area of the one side edge of the first sensing area SA1. The second sensing area SA2 and the third sensing area SA3 may be spaced apart from each other in a second direction DR2.

The plurality of sensing patterns SPN, SPNC1, SPNC2, SP1, SP2, SP3a, and SP3b may be disposed in the sensing area SA to sense the touch. The plurality of sensing patterns SPN, SPNC1, SPNC2, SP1, SP2, SP3a, and SP3b may include a transparent conductive oxide. For example, the plurality of sensing patterns SPN, SPNC1, SPNC2, SP1, SP2, SP3a, and SP3b may include at least one of indium zinc oxide (IZO), indium tin oxide (ITO), indium gallium oxide (IGO), indium zinc gallium oxide (IGZO), and mixtures/compounds thereof. However, the inventive concept is not limited thereto. For example, the plurality of sensing patterns SPN, SPNC1, SPNC2, SP1, SP2, SP3a, and SP3b may include a metal material. The metallic material may include, for example, molybdenum, silver, titanium, copper, aluminum, or alloys thereof. In this case, the plurality of sensing patterns SPN, SPNC1, SPNC2, SP1, SP2, SP3a, and SP3b may be provided in a metal mesh structure to reduce the possibility that patterns are visually recognized from the outside.

The plurality of sensing patterns SPN, SPNC1, SPNC2, SP1, SP2, SP3a and SP3b may be divided into a normal sensing pattern SPN, a first notch sensing pattern SPNC1 and a second notch sensing pattern SPNC2 depending on arranged positions. The plurality of sensing patterns SPN, SPNC1, SPNC2, SP1, SP2, SP3a and SP3b may be divided into a first sensing pattern SP1, a second sensing pattern SP2, and third sensing patterns SP3a and SP3b depending on which sensing electrode is configured.

For example, the normal sensing pattern SPN may be a sensing pattern disposed in the first sensing area SA1. The first notch sensing pattern SPNC1 may be a sensing pattern disposed in the second sensing area SA2. The second notch sensing pattern SPNC2 may be a sensing pattern disposed in the third sensing area SA3. In addition, the sensing patterns arranged along the first direction DR1 and electrically connected to each other may constitute the first sensing electrode SE1.

The sensing patterns constituting the first sensing electrode SE1 may be referred to as a first sensing pattern SP1. The sensing patterns arranged in the first sensing area SA1 and arranged in the second direction DR2 and electrically connected to each other may constitute the second sensing electrode SE2. The sensing patterns constituting the second sensing electrode SE2 may be referred to as a second sensing pattern SP2. The sensing patterns arranged in the second sensing area SA2 and arranged in the second direction DR2 and electrically connected to each other may constitute the third sensing electrode SE3a. The sensing patterns constituting the third sensing electrode SE3a may be referred to as a third sensing pattern SP3a. The sensing patterns arranged in the third sensing area SA3 and arranged in the second direction DR2 and electrically connected to each other may constitute the third sensing electrode SE3b. The sensing patterns constituting the third sensing electrode SE3b may be referred to as a third sensing pattern SP3b.

That is, depending on which of the sensing electrodes constitute the normal sensing pattern SPN, the first notch sensing pattern SPNC1, and the second notch sensing pattern SPNC2, part of the normal sensing pattern SPN, the first notch sensing pattern SPNC1, and the second notch sensing pattern SPNC2 may be referred to as a first sensing pattern SP1, another part of the normal sensing pattern SPN may be referred to as a second sensing pattern SP2, another part of the first notch sensing pattern SPNC1 may be referred to as a third sensing pattern SP3a, and another part of the second notch sensing pattern SPNC2 may be referred to as a third sensing pattern SP3b.

The first sensing electrode SE1 may be provided in plural number and the first sensing electrodes SE1 may be arranged in the second direction DR2. The second sensing electrode SE2 may be provided in plural number and the second sensing electrodes SE2 may be arranged in the first direction DR1.

In FIG. 3, the third sensing electrodes SE3*a* and SE3*b* are provided for the second sensing area SA2 and the third sensing area SA3, respectively. However, embodiments of the present invention are not limited thereto, and a plurality of third sensing electrodes SE3*a* and SE3*b* may be provided in each of the second sensing area SA2 and the third sensing area SA3.

The first sensing patterns SP1 may be electrically connected by the first sensing connection electrode BSP1. The first sensing connection electrode BSP1 may electrically connect two adjacent first sensing patterns SP1. The second sensing patterns SP2 may be electrically connected by the second sensing connection electrode BSP2. The second sensing connection electrode BSP2 may electrically connect the two second sensing patterns SP2 adjacent to each other. The third sensing patterns SP3*a* are electrically connected by the third sensing connection electrode BSP3*a*, and the third sensing patterns SP3*b* may be electrically connected by the third sensing connection electrode BSP3*b*.

In the first sensing area SA1, the first sensing connection electrode BSP1 and the second sensing connection electrode BSP2 may intersect each other in a plane view and may be insulated from each other on a cross section. In addition, in the second sensing area SA2, the first sensing connection electrode BSP1 and the third sensing connection electrode BSP3*a* may intersect each other in the plane view and may be insulated from each other on a cross section. In the third sensing area SA3, the first sensing connection electrode BSP1 and the third sensing connection electrode BSP3*b* may intersect each other in the plane view and may be insulated from each other on a cross section. The second sensing connection electrode BSP2, the third sensing connection electrode BSP3*a*, and the third sensing connection electrode BSP3*b* may be disposed on the same layer and may be formed through the same process.

The sensing lines SL electrically connected to the first through third sensing electrodes SE1, SE2, SE3*a*, and SE3*b* may be arranged in the non-sensing area NSA. One end of each of the sensing lines SL may be connected to one of the first to third sensing electrodes SE1, SE2, SE3*a* and SE3*b*, and the other end may be connected to the pad part PD. The pad part PD receives an electrical signal from an external driving circuit and transfers it to at least one of the sensing lines SL, or transfers an external touch sensing signal generated in the sensing area SA to the driving circuit.

The sensing lines SL may include a first sensing line SL1, a second sensing line SL2, a third sensing line SL3, and a fourth sensing line SL4. The first sensing line SL1 may be connected to one end of the first sensing electrode SE1, the second sensing line SL2 may be connected to one end of the second sensing electrode SE2, and the third sensing line SL3 may be connected to one end of the third sensing electrode SE3*b*. The fourth sensing line SL4 may be connected to the other end of the first sensing electrode SE1. That is, one side of the first sensing electrode SE1 is connected to the pad part PD through the first sensing line SL1 and the other side of the first sensing electrode SE1 is connected to the pad part PD through the fourth sensing line SL4. By connecting a plurality of lines to one sensing electrode, problems such as a decrease in sensitivity due to a voltage drop of an electrical signal depending on a position may be improved or avoided.

The first notch sensing pattern SPNC1 and the second notch sensing pattern SPNC2 spaced in the second direction DR2 may be electrically connected to each other by a connection line CL. That is, the third sensing electrode SE3*a* arranged in the second sensing area SA2 and the third sensing electrode SE3*b* arranged in the third sensing area SA3 may be electrically connected to each other by the connection line CL. One end of the connection line CL is connected to the third sensing electrode SE3*a* and the other end of the connection line CL is connected to the third sensing electrode SE3*b*. Accordingly, the third sensing electrode SE3*a* may receive an electrical signal from the driving circuit through the third sensing line SL3, or may transmit a sensing signal to the driving circuit.

The connection line CL may be arranged between the first sensing line SL1 and the first sensing area SA1. That is, the connection line CL may be arranged between the first sensing line SL1 and the normal sensing pattern SPN. The area where the connection line CL is disposed may be a non-sensing area NSA between the second sensing area SA2 and the third sensing area SA3.

The first sensing line SL1 is separated from the first sensing electrode SE1 in the first sensing area SA1 by the connection line CL. Accordingly, a connection part CM may be provided to connect the first sensing line SL1 to the first sensing electrode SE1 in the first sensing area SA1.

A part of the connection part CM is connected to the first sensing line SL1 and another part of the connection part CM is connected to the first sensing electrode SE1. Therefore, the first sensing line SL1 and the first sensing electrode SE1 may be electrically connected. In this embodiment, the first sensing electrode SE1 connected to the connection part CM may be the first sensing electrode SE1 composed of the normal sensing pattern SPN. The description of the connection part CM is made in detail below.

Figure 4:
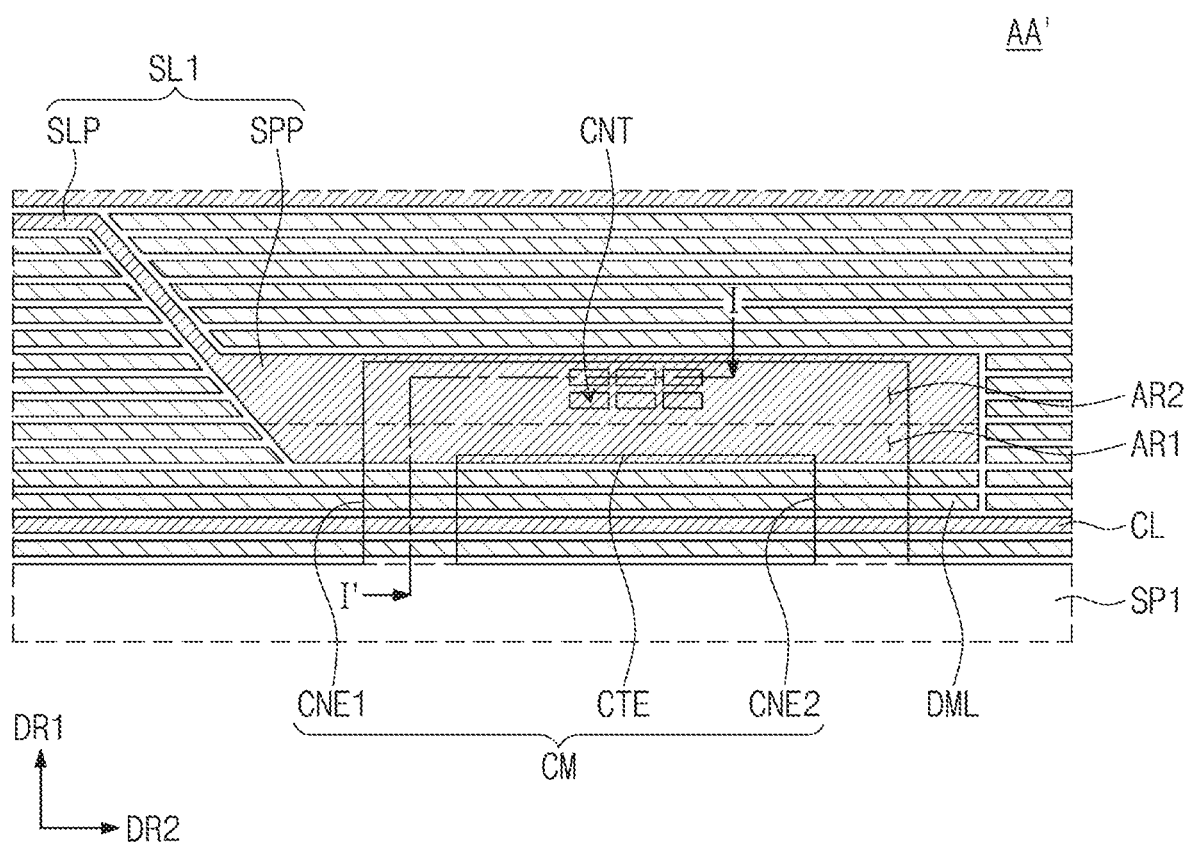
FIG. 4 is an enlarged plan view of a portion of FIG. 3 according to some example embodiments of the present invention.
Figure 5B:
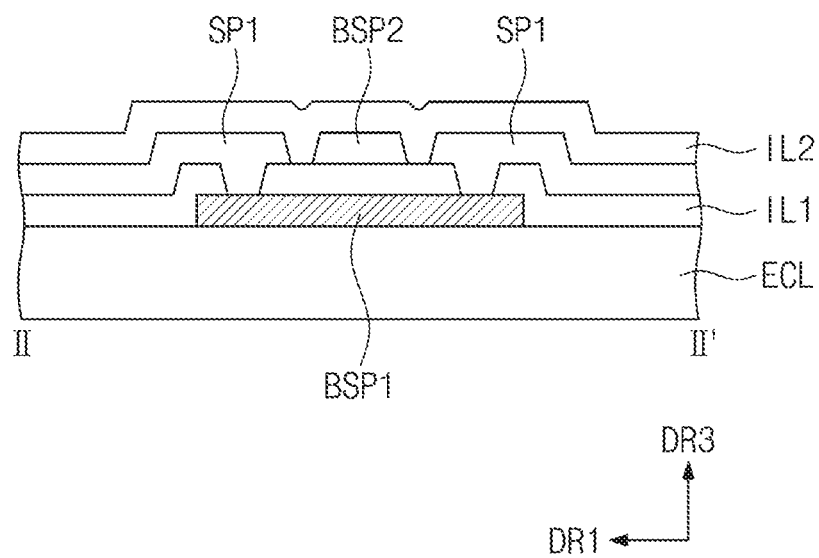
FIG. 5B is a cross-sectional view taken along the line II-II' shown in FIG. 3.

FIG. 4 is an enlarged plan view of one portion of FIG. 3 according to some example embodiments of the present invention, and FIG. 5A is a cross-sectional view taken along the line I-I 'of FIG. 4. Specifically, FIG. 4 is an enlarged view of the area AA' shown in FIG. 3. FIG. 5B is a cross-sectional view taken along the line II-II' shown in FIG. 3.

Referring to FIGS. 3 to 5A, the connection part CM may include a first connection electrode CNE1, a second connection electrode CNE2, and a contact electrode CTE.

The first connection electrode CNE1 and the second connection electrode CNE2 may extend in a direction from the first sensing pattern SP1 to the first sensing line SL1. For example, the direction may be a first direction DR1. The first connection electrode CNE1 and the second connection electrode CNE2 may be provided spaced apart from each other in the second direction DR2, and the first connection electrode CNE1 and the second connection electrode CNE2 may be connected to each other by a contact electrode CTE. The first sensing pattern SP1 shown in FIG. 4 may also be referred to as a normal sensing pattern SPN arranged in the first sensing area SA1 described above with reference to FIG. 3.

The contact electrode CTE may extend along a direction different from the direction in which the first connection electrode CNE1 extends from the first connection electrode CNE1. For example, the contact electrode CTE may extend from the first connection electrode CNE1 in a second direction DR2.

Referring to FIG. 5A, a first insulating layer IL1 is arranged between the connection part CM and the first sensing line SL1. The contact hole CNT may be provided in the first insulating layer IL1. The contact hole CNT may be provided only in an area overlapping the contact electrode CTE in a plane view. The connection part CM may be in contact with the first sensing line SL1 through the contact hole CNT. In the plane view, the contact hole CNT may be provided apart from the first connection electrode CNE1 and the second connection electrode CNE2. Thus, the contact holes CNT may be non-overlapping with the first connection electrode CNE1 and the second connection electrode CNE2 in the plane view.

In FIG. 4, a plurality of contact holes CNTs are illustrated. However, the inventive concept is not limited thereto. For example, the contact hole CNT may be provided as a single hole. Although FIG. 4 illustrates an example embodiment in which the contact holes CNT are provided in a matrix of two rows and three columns, the arrangement of the contact holes CNT may be variously modified as long as it connects the contact electrode CTE and the first sensing line SL1.

According to some example embodiments of the present invention, because the contact hole CNT connecting the first sensing line SL1 and the first sensing pattern SP1 does not overlap on the extended area of the first connection electrode CNE1 and the second connection electrode CNE2, the reliability of the product may be improved. For example, charge may accumulate in the first sensing line SL1 due to the plasma or other causes used in the process.

After the contact hole CNT is provided in the first insulating layer IL1, accumulated electric charge may be discharged through the contact hole CNT, and at this time, the first insulating layer IL1 adjacent to the area where the contact hole CNT is formed may be destroyed. When the broken portion of the first insulating layer IL1 is covered by the first connection electrode CNE1 or the second connection electrode CNE2, a configuration (for example, a connection line CL) arranged under the first insulating layer IL1 may be electrically connected to the first connection electrode CNE1 or the second connection electrode CNE2. This may cause unnecessary short circuit and affect the signal. However, according to some example embodiments of the present invention, the contact holes CNT are apart from each other and arranged on the area where the first connection electrode CNE1 and the second connection electrode CNE2 extend. Therefore, even if the first insulating layer IL is broken, the probability that the destroyed area is covered by the first connection electrode CNE1 or the second connection electrode CNE2 may be reduced. Thus, instances of an unnecessary short circuit phenomenon may be prevented or reduced, and the product reliability may be improved.

In addition, in one embodiment of the inventive concept, the first sensing line SL1 may be spaced apart from the connection line CL by a distance (e.g., a predetermined distance) to prevent or reduce instances of an unnecessary short circuit. As a result, the probability that the first insulating layer IL1 overlapping the connection line CL in the plane view is destroyed by the discharge phenomenon occurring adjacent to the contact hole CNT formed on the first sensing line SL1 may be reduced.

Also, according to some example embodiments of the present invention, dummy lines DML may be further arranged around the first sensing line SL1. The dummy line DML may be a line where no signal is provided. In the plane view, the dummy line DML may be provided surrounding the periphery of the area where the contact hole CNT is formed. The dummy line DML may also be arranged between the first sensing line SL1 and the connection line CL. Therefore, even if one area of the first insulating layer IL1 overlapping with the dummy line DML is destroyed, because no signal is provided on the dummy line DML, it may not affect the signal transmitted or received through the first sensing line SL1.

The first sensing line SL1 may include a sensing line part SLP and a sensing pad SPP. The sensing pad SPP may be defined as an area wider than the sensing line part SLP. The sensing pad SPP may be divided into a first area AR1 and a second area AR2. The first area AR1 may be an area adjacent to the connection line CL than the second area AR2. Thus, the second area AR2 may be spaced apart from the connection line CL with the first area AR1 therebetween.

The contact holes CNT may be provided overlapping the second area AR2 and the contact holes CNT may not overlap the first area AR1. By providing the contact hole CNT as far as possible to the connection line CL, it is possible to reduce the probability of damage to one area of the first insulating layer IL1 overlapping the connection line CL in the plane view.

Referring to FIG. 5A, the first sensing line SL1, the dummy line DML, and the connection line CL are disposed on the same layer. The first sensing line SL1, the dummy line DML, and the connection line CL may be simultaneously formed through the same process. However, for ease of division of each configuration in FIGS. 4 and 5A, the hatching of the dummy line DML is indicated by a different hatching from that of the first sensing line SL1 and the connection line CL.

The first sensing line SL1, the dummy line DML, and the connection line CL are covered by the first insulating layer IL1. The connection part CM and the first sensing pattern SP1 may be disposed on the first insulating layer IL1. That is, the connection part CM and the first sensing pattern SP1 may be simultaneously formed through the same process. The connection part CM and the first sensing pattern SP1 are covered by the second insulating layer IL2. The first insulating layer IL1 and the second insulating layer IL2 may be an inorganic layer or an organic layer. When the first insulating layer IL1 and the second insulating layer IL2 are inorganic layers, the first insulating layer IL1 and the second insulating layer IL2 may include at least one of silicon oxide, silicon nitride, and silicon oxynitride. However, embodiments of the present invention are not limited thereto.

Referring to FIGS. 5A and 5B, the first sensing connection electrode BSP1 is arranged on the same layer as the first sensing line SL1, the dummy line DML, and the connection line CL, and the second sensing connection electrode BSP2 may be arranged on the same layer as the connection part CM and the first sensing pattern SP1. The first and second sensing connection electrodes BSP1 and BSP2 may be insulated from each other by the first insulating layer IL1 arranged therebetween.

According to some example embodiments of the present invention, the connection part CM may include the same material as the first sensing pattern SP1. For example, the connection part CM may include a transparent conductive oxide. For example, it may include at least one of indium zinc oxide (IZO), indium tin oxide (ITO), indium gallium oxide (IGO), indium zinc gallium oxide (IGZO), and mixtures/compounds thereof. In another example, the connection part CM may include a metallic material. The metallic material may include, for example, molybdenum, silver, titanium, copper, aluminum, or alloys thereof.

Figure 6:
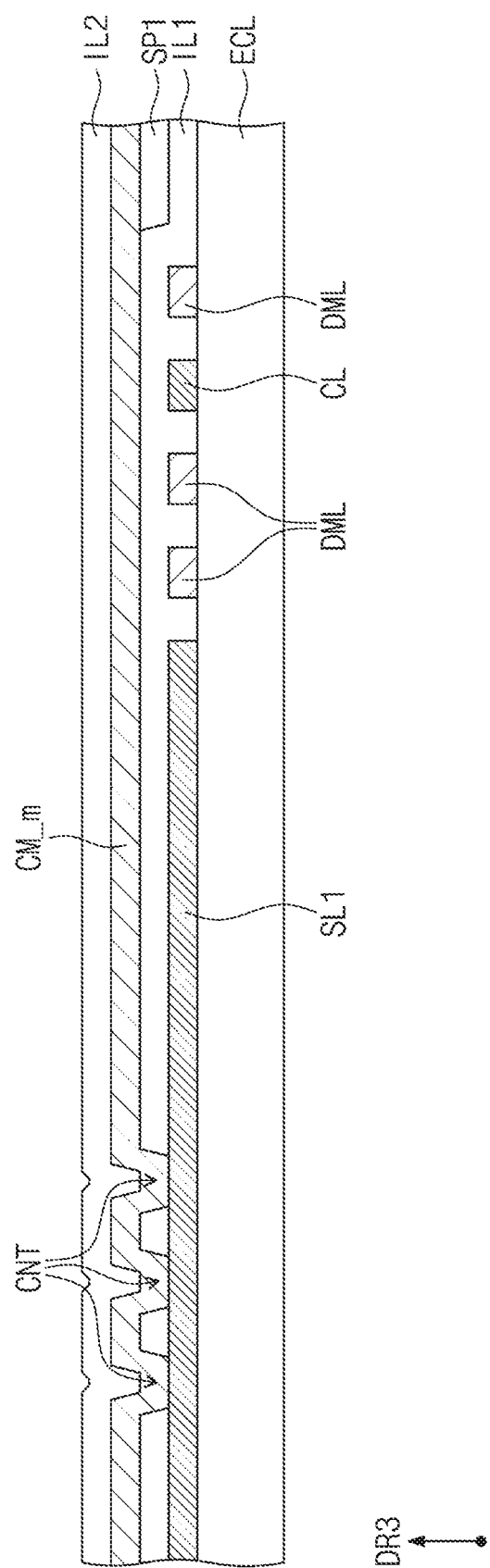
FIG. 6 is a cross-sectional view taken along the area corresponding to the line I-I' shown in FIG. 4.

FIG. 6 is a cross-sectional view taken along the area corresponding to the line I-I' shown in FIG. 4. In the description of FIG. 6, the same reference numerals are given to the components described above, and some repetitive description thereof will be omitted.

Referring to FIG. 6, a connection part CM_m may be formed by a process different from the process of forming the first sensing pattern SP1. In this case, the first sensing pattern SP1 and the connection part CM_m may be formed of different materials. For example, the first sensing pattern SP1 may include a transparent conductive oxide, and the connection part CM_m may include a metallic material. The metallic material may include molybdenum, silver, titanium, copper, aluminum, or alloys thereof but is not limited thereto.

Figure 7:
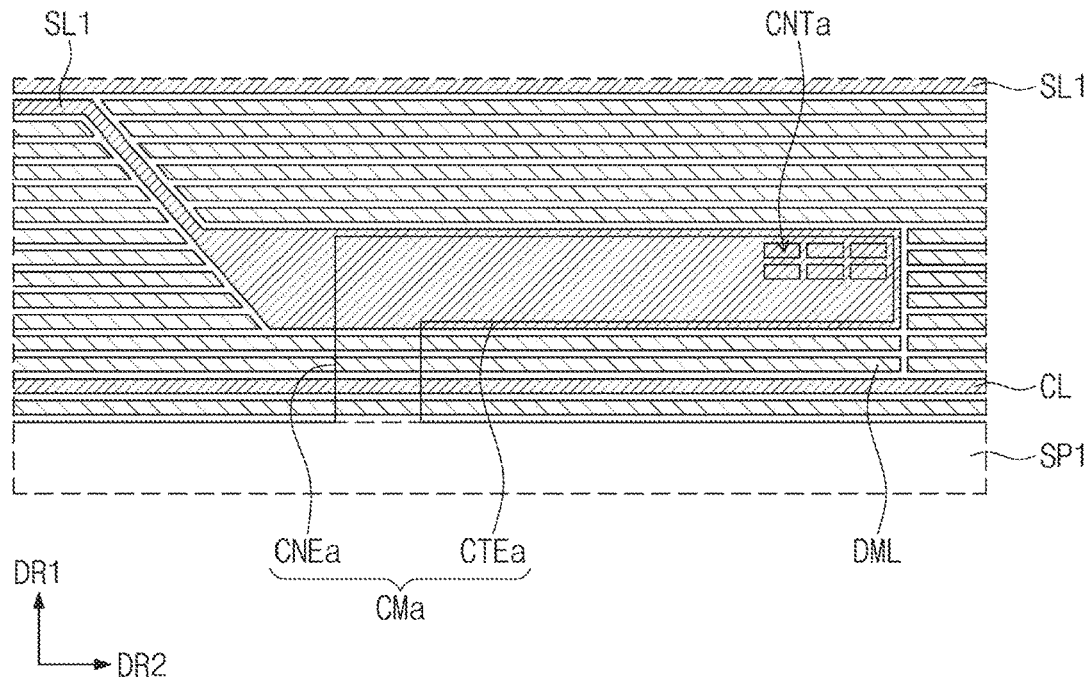
FIG. 7 is an enlarged plan view of an area corresponding to the area AA' shown in FIG. 3 according to some example embodiments of the present invention.

FIG. 7 is an enlarged plan view of an area corresponding to AA' shown in FIG. 3 according to an embodiment of the inventive concept. In the description of FIG. 7, the same reference numerals are given to the components described with reference to FIG. 4, and a description thereof will be omitted.

Referring to FIG. 7, the connection part CMa may include a connection electrode CNEa and a contact electrode CTEa. The connection electrode CNEa may extend in the direction from the first sensing pattern SP1 to the first sensing line SL1. For example, the direction may be a first direction DR1. The contact electrode CTE may extend along a direction different from the direction in which the first connection electrode CNE1 extends from the first connection electrode CNE1. For example, the contact electrode CTEa may extend from the connection electrode CNEa along the second direction DR2.

The first insulating layer IL1 (see FIG. 5A) is arranged between the connection part CMa and the first sensing line SL1. The contact hole CNTa may be provided in the first insulating layer IL1. The contact hole CNTa may be provided only in an area overlapping the contact electrode CTEa in a plane view. Within the area overlapping the contact electrode CTEa, the contact hole CNTa may be provided in the area as far as possible from the connection electrode CNEa and the connection line CL.

Therefore, as a discharge phenomenon occurs through the contact hole CNTa, even if the first insulating layer IL1 (see FIG. 5A) adjacent to the area where the contact hole CNTa is formed is broken, the probability that the destroyed area and the connection electrode CNEa overlap each other in the plane view may be reduced. Therefore, instances of the short circuit with the undesired line may be reduced or prevented, and as a result, the reliability of the product may be improved.

Figure 8:
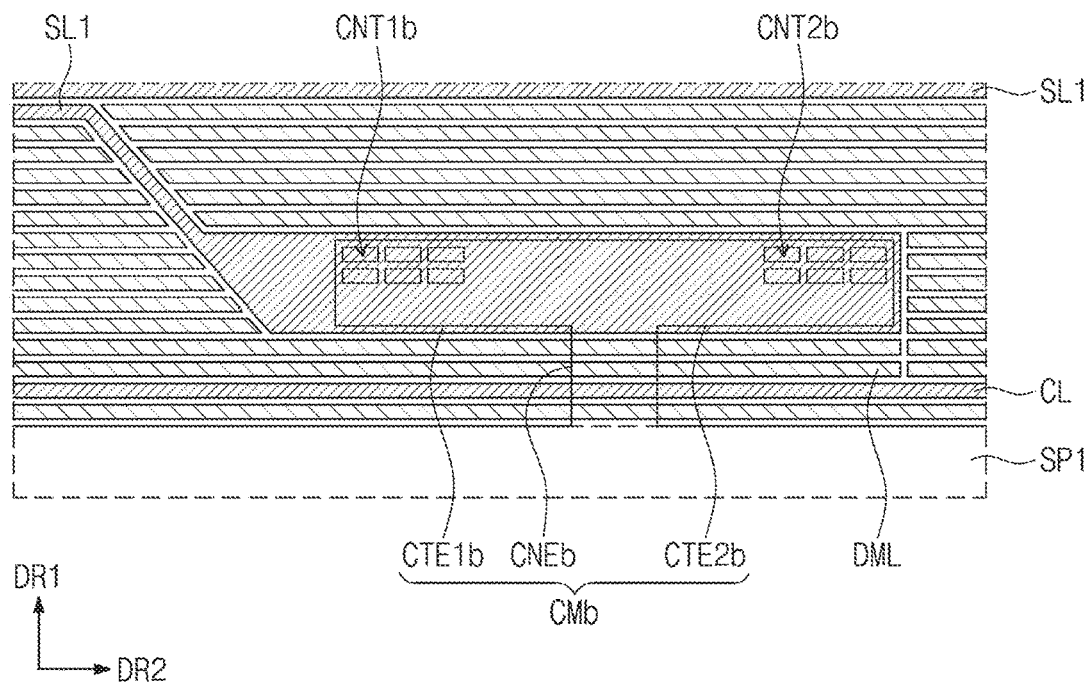
FIG. 8 is an enlarged plan view of an area corresponding to the area AA' shown in FIG. 3 according to some example embodiments of the present invention.

FIG. 8 is an enlarged plan view of an area corresponding to AA' shown in FIG. 3 according to some example embodiments of the present invention. In the description of FIG. 8, the same reference numerals are given to the components described with reference to FIG. 4, and a description thereof will be omitted.

Referring to FIG. 8, the connection part CMb may include a connection electrode CNEb, a first contact electrode CTE1$b$, and a second contact electrode CTE2$b$.

The connection electrode CNEb extends in a first direction DR1 from the first sensing pattern SP1 to the first sensing line SL1. The first contact electrode CTE1$b$ extends from the connection electrode CNEb in the second direction DR2. The second contact electrode CTE2$b$ extends from the connection electrode CNEb in a direction opposite to the second direction DR2. The first contact electrode CTE1$b$ and the second contact electrode CTE2$b$ may be disposed apart from each other with a connection electrode CNEb therebetween. Therefore, the connection part CMb may have a T shape in a plane view.

Each of the first contact electrode CTE1$b$ and the second contact electrode CTE2$b$ is electrically connected to the first sensing line SL1 through the first and second contact holes CNT1$b$ and CNT2$b$ provided in the first insulating layer IL1 described with reference to FIG. 5A.

The first contact hole CNT1$b$ may be provided only in an area overlapping the first contact electrode CTE1$b$ in the plane view and the second contact hole CNT2$b$ may be provided only in an area overlapping the second contact electrode CTE2$b$ in the plane view. The first and second contact holes CNT1$b$ and CNT2$b$ may be provided in an area as far as possible from the connection electrode CNEb and the connection line CL.

Figure 9A:
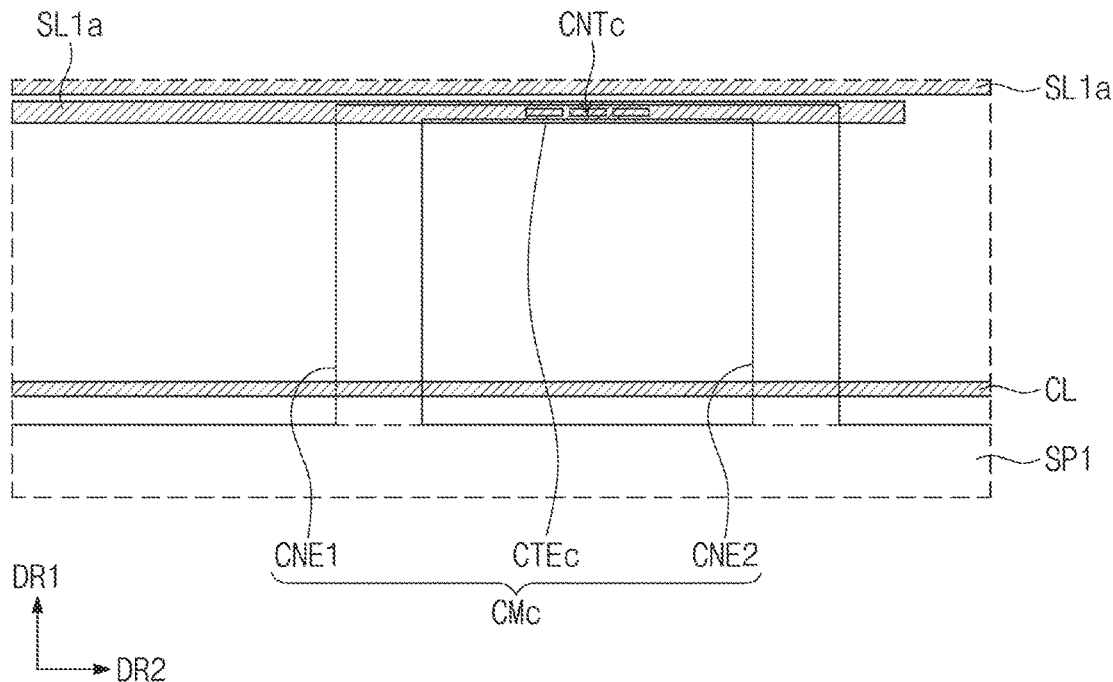
FIG. 9A is an enlarged plan view of an area corresponding to the area AA' shown in FIG. 3 according to some example embodiments of the present invention.

FIG. 9A is an enlarged plan view of an area corresponding to the area AA' shown in FIG. 3 according to some example embodiments of the present invention. In the description of FIG. 9A, the same reference numerals are given to the components described with reference to FIG. 4, and some repetitive description thereof will be omitted.

Referring to FIG. 9A, there is a difference in width of the first sensing line SL1$a$ as compared with FIG. 4. In FIG. 4, the width of one area overlapping the contact electrode CTE of the first sensing line SL1 is widened to provide the contact hole CNT as far as possible from the connection line CL. Alternatively, the first sensing line SL1$a$ of FIG. 9A may have a constant width.

The connection part CMc may include a first connection electrode CNE1, a second connection electrode CNE2, and a contact electrode CTEc, and the first connection electrode CNE1 and the second connection electrode CNE2 may be arranged or positioned apart from each other with the contact electrode CTEc therebetween. The contact electrode CTEc may have a width narrower than that of the contact electrode CTE of FIG. 4, corresponding to the width of the overlapping first sensing line SL1$a$ in a plane view. However, this is illustrative, and in another embodiment of the inventive concept, the contact electrode CTEc may have the same width as the contact electrode CTE of FIG. 4.

In order to electrically connect the connection part CMc and the first sensing line SL1$a$, the contact hole CNTc provided in the first insulating layer IL1 (see FIG. 5A) may be provided in an area overlapping the contact electrode CTEc. The contact hole CNTc may be non-overlapping with the first connection electrode CNE1 and the second connection electrode CNE2 on a plane.

According to some example embodiments of the present invention, the dummy line DML (see FIG. 4) may be omitted. In this case, the first sensing line SL1$a$ and the connection line CL may be provided as spaced as possible. As the first sensing line SL1$a$ and the connection line CL are provided apart from each other, the probability that the first insulating layer IL1 (see FIG. 5A) overlapping with the connection line CL in the plane view is destroyed may be reduced.

Figure 9B:
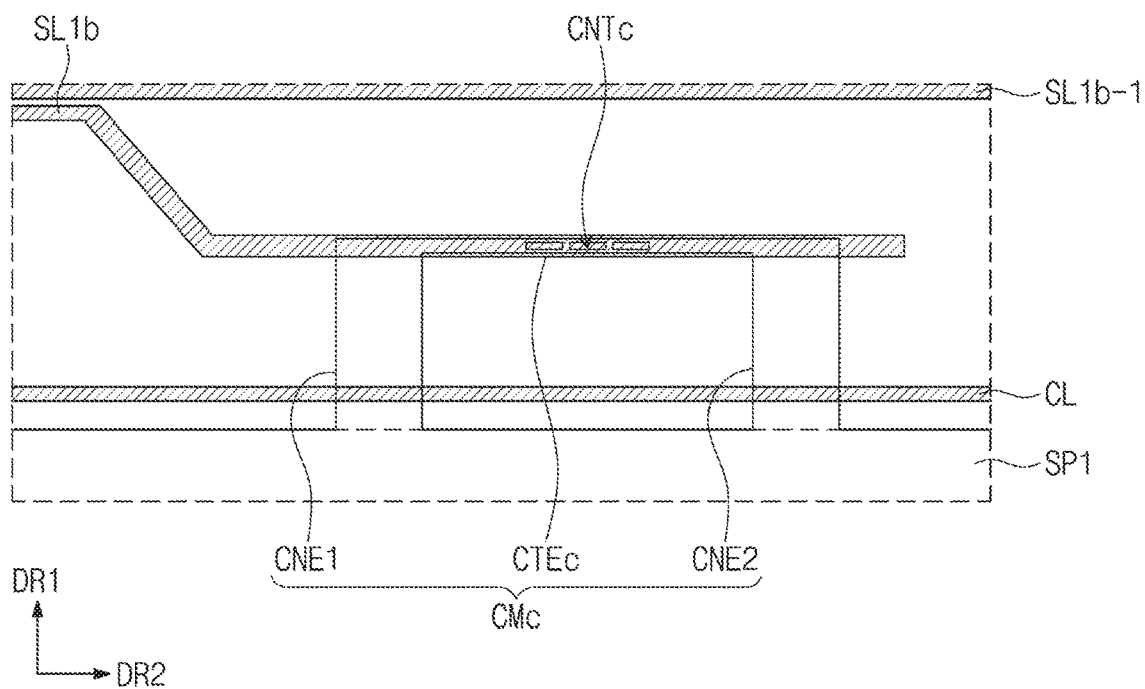
FIG. 9B is an enlarged plan view of an area corresponding to the area AA' shown in FIG. 3 according to some example embodiments of the present invention.

FIG. 9B is an enlarged plan view of an area corresponding to the area AA' shown in FIG. 3 according to some example embodiments of the present invention. In the description of FIG. 9B, the same reference numerals are given to the components described with reference to FIGS. 4 and 9A, and some repetitive description thereof will be omitted.

FIG. 9B differs from FIG. 9A in the arrangement position and shape of the first sensing line SL1$b$. According to some example embodiments of the present invention, the connection line CL is provided at a distance (e.g., a predetermined distance) from a portion of the first sensing line SL1$b$ connected to the connection part CMc. In consideration of not only the connection line CL but also other conductors arranged around the first sensing line SL1$b$, for example, the distance relationship with the first sensing line SL1b-1, the distance (e.g., the predetermined distance) may be determined.

Also, a dummy line may be further arranged in an area between the two first sensing lines SL1b and SL1b-1 and an area between the first sensing line SL1b and the connection line CL.

The connection parts CM, CMa, CMb, and CMc described above with reference to FIG. 4 and FIGS. 7 to 9B may be applied to connect a second configuration (e.g., the first sensing pattern SP1) and the third configuration (e.g., the first line SL1a) spaced by the first configuration (e.g., the connection line CL). Each of the connection parts CM, CMa, CMb, and CMc is connected to the second configuration and overlaps with the first configuration in a plane view, and includes a connection electrode extending toward the third configuration and a contact electrode extending in a direction different from the extending direction of the connection electrode.

An insulating layer may be arranged between the connection parts CM, CMa, CMb, and CMc and the first configuration and between the connection parts CM, CMa, CMb, and CMc and the third configuration. In the area overlapping the contact electrode, the third component is connected to the connection parts CM, CMa, CMb, and CMc through the contact holes provided in the insulating layer. That is, contact holes are provided spaced apart on the area where the connection electrode extends. Thus, even if the insulating layer around the contact hole is destroyed by the discharge, the probability that the destroyed area is covered by the connection electrode may be reduced. Thus, instances of an unnecessary short circuit phenomenon may be prevented or reduced, and the product reliability may be improved.

The connection part for connecting the second and third configurations separated from each other by the first configuration includes a connection electrode extends along the first direction and connected to the second configuration and a contact electrode extending in a second direction different from the first direction. The connection part may be connected to the third component through a contact hole provided in an insulating layer overlapping the contact electrode. That is, contact holes are provided spaced apart on the area where the connection electrode extends. Thus, even if the insulating layer around the contact hole is destroyed by the discharge, the probability that the destroyed area is covered by the connection electrode may be reduced. Thus, instances of an unnecessary short circuit between the connection electrode and the other conductor may be prevented or reduced, and the product reliability may be improved.

Although aspects of some example embodiments of the present invention have been described, it is understood that the present invention is not limited to these example embodiments but various changes and modifications can be made by one ordinary skilled in the art within the spirit and scope of the present invention as defined in the following claims, and their equivalents.

What is claimed is:

1. An electronic device comprising:
    a base layer having a first region and a second region adjacent to the first region;
    a first pattern, a second pattern, and a third pattern located in the first region, with a portion of the second region being between the second pattern and the third pattern;
    a line located in the second region, the line being electrically connected to the first pattern and spaced from the first pattern;
    a connection line located in the second region, the connection line being located between the first pattern and the line and electrically connected to the second pattern and the third pattern;
    a connection part electrically connected to the first pattern and the line; and
    a dummy line located between the line and the connection line,
    wherein the line is electrically connected to the first pattern through the connection part at the portion of the second region between the second pattern and the third pattern, and the line and the first pattern are not directly connected.

2. The electronic device of claim 1, wherein the connection part overlaps a portion of the line, a portion of the connection line, and a portion of the dummy line.

3. The electronic device of claim 2, wherein the line comprises a first line portion, and a second line portion having a width greater than that of the first line portion, and
    wherein the connection part contacts the second line portion.

4. The electronic device of claim 3, wherein the second line portion is divided into a first line area adjacent to the connection line and a second line area spaced from the connection line with the first line area interposed therebetween in a plan view, and
    wherein the connection part contacts the line at the second line portion.

5. The electronic device of claim 2, wherein the connection part comprises a first connection portion extending from the first pattern in a direction toward the line and a second connection portion extending from the first connection portion in a direction different from the extending direction of the first connection portion, and
    wherein the connection part contacts the line through the second connection portion.

6. The electronic device of claim 5, wherein the connection part further comprises a third connection portion extending from the second connection portion in a direction toward the first pattern, and
    wherein the first connection portion and the third connection portion are spaced from each other with the second connection portion therebetween.

7. The electronic device of claim 5, wherein the second connection portion is spaced from the connection line in a plan view.

8. The electronic device of claim 5, wherein the second connection portion overlaps the line, and the second connection portion does not overlap the dummy line and the connection line in a plan view.

9. The electronic device of claim 5, further comprising an insulating layer between the line and the connection part on a cross section,
    wherein the second connection portion passes through a contact hole in the insulating layer and the second connection portion contacts the line.

10. The electronic device of claim 2, wherein the connection part comprises a transparent conductive oxide or a metallic material.

11. The electronic device of claim 2, wherein the first region comprises a first sensing region, a second sensing region protruding from the first sensing region in a first direction, and a third sensing region protruding from the first sensing region in the first direction, and
    wherein the second sensing region and the third sensing region are spaced from each other with a portion of the second region interposed therebetween.

12. The electronic device of claim 11, wherein the first pattern is located in the first sensing region, the second pattern is located in the second sensing region, and the third pattern is located in the third sensing region, and wherein the connection line is located between the second sensing region and the third sensing region.

13. The electronic device of claim 12, wherein the dummy line is located between the second sensing region and the third sensing region.

14. The electronic device of claim 1, further comprising an additional dummy line located between the connection line and the first pattern.

15. An electronic device comprising:
- a base layer having a sensing area, the sensing area including a first sensing area, a second sensing area protruding from the first sensing area in a first direction, and a third sensing area protruding from the first sensing area in the first direction, and a non-sensing area adjacent to the sensing area;
- a first pattern in the first sensing area;
- a second pattern in the second sensing area;
- a third pattern in the third sensing area;
- a line in the non-sensing area, the line being electrically connected to the first pattern and spaced from the first pattern;
- a connection line in the non-sensing area, the connection line being located between the first pattern and the line and electrically connected to the second pattern and the third pattern; and
- a connection part electrically connected to the first pattern and the line, wherein the connection part overlaps a portion of the line and a portion of the connection line.

16. The electronic device of claim 15, further comprising a dummy line located between the line and the connection line.

17. The electronic device of claim 15, further comprising a dummy line located between the first pattern and the connection line.

18. The electronic device of claim 15, wherein the connection part comprises a first connection portion extending from the first pattern in a direction toward the line and a second connection portion extending from the first connection portion in a direction different from the extending direction of the first connection portion, and wherein the connection part contacts the line through the second connection portion.

19. The electronic device of claim 18, wherein the second connection portion is spaced from the connection line in a plan view.

20. The electronic device of claim 18, wherein the line comprises a first line portion, and a second line portion having a width greater than that of the first line portion, and wherein the connection part contacts the second line portion.

* * * * *